United States Patent
Evans

(10) Patent No.: US 6,514,865 B1
(45) Date of Patent: Feb. 4, 2003

(54) METHOD OF REDUCING INTERLAYER DIELECTRIC THICKNESS VARIATION FEEDING INTO A PLANARIZATION PROCESS

(75) Inventor: Allen L. Evans, Dripping Springs, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/044,532

(22) Filed: Jan. 11, 2002

(51) Int. Cl.$^7$ .......................................... H01L 21/302
(52) U.S. Cl. ........................ 438/710; 438/14; 438/5
(58) Field of Search .......................... 438/14, 15, 16, 438/710, 5, 9; 356/445, 376

(56) References Cited

U.S. PATENT DOCUMENTS

| | | | | |
|---|---|---|---|---|
| 5,270,222 A | * | 12/1993 | Moslehi ...................... 356/433 |
| 5,332,467 A | * | 7/1994 | Sune et al. .................. 438/624 |
| 5,394,340 A | * | 2/1995 | Inkpen et al. ............. 244/134 F |
| 5,485,097 A | * | 1/1996 | Wang .......................... 324/765 |
| 5,621,332 A | * | 4/1997 | Inkpen et al. ............... 324/650 |
| 5,900,633 A | * | 5/1999 | Solomon et al. ....... 250/339.08 |
| 5,989,764 A | * | 11/1999 | Adams ......................... 430/30 |
| 6,057,603 A | * | 5/2000 | Dawson ...................... 257/758 |
| 6,383,824 B1 | * | 5/2000 | Lensing ...................... 356/445 |
| 6,072,191 A | * | 6/2000 | La et al. ......................... 257/48 |
| 6,077,764 A | * | 6/2000 | Sugiarto et al. ............ 438/597 |
| 6,117,783 A | * | 9/2000 | Small et al. .................... 106/3 |
| 6,132,289 A | * | 10/2000 | Labunsky et al. ........... 451/288 |
| 6,230,069 B1 | * | 5/2001 | Campbell et al. ........... 700/121 |
| 6,232,188 B1 | * | 5/2001 | Murtaza et al. ............. 257/327 |
| 6,256,100 B1 | * | 7/2001 | Banet et al. ................. 356/432 |
| 6,304,326 B1 | * | 10/2001 | Aspnes et al. ........... 356/243.1 |
| 6,309,900 B1 | * | 10/2001 | Maury et al. .................. 257/48 |
| 6,313,039 B1 | * | 11/2001 | Small et al. .................... 106/3 |
| 6,349,128 B1 | * | 2/2002 | Nelson ......................... 378/44 |
| 6,350,179 B2 | * | 2/2002 | Campbell et al. ........... 451/285 |
| 6,368,879 B1 | * | 4/2002 | Toprac ........................... 438/5 |
| 6,381,009 B1 | * | 4/2002 | McGahan .................... 356/369 |
| 6,381,303 B1 | * | 4/2002 | Vu et al. ....................... 378/46 |
| 6,403,151 B1 | * | 6/2002 | Davis et al. ............... 204/192.1 |
| 6,411,385 B2 | * | 6/2002 | Aspnes et al. .............. 356/369 |
| 6,428,673 B1 | * | 8/2002 | Ritzdorf et al. .......... 204/228.7 |

* cited by examiner

*Primary Examiner*—John F. Niebling
*Assistant Examiner*—Olivia Luk
(74) *Attorney, Agent, or Firm*—Williams, Morgan & Amerson

(57) ABSTRACT

A method is provided that comprises forming a first dielectric layer on a workpiece, measuring a thickness of the first dielectric layer, and forming a second dielectric layer above the first dielectric layer, the second dielectric layer being formed to a thickness that is determined based upon the measured thickness of the first dielectric layer.

25 Claims, 9 Drawing Sheets

US 6,514,865 B1

METHOD OF REDUCING INTERLAYER DIELECTRIC THICKNESS VARIATION FEEDING INTO A PLANARIZATION PROCESS

BACKGROUND OF THE INVENTION

1. Field of the Invention

This invention relates generally to semiconductor fabrication technology, and, more particularly, to a method for semiconductor fabrication supervision and optimization.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing defects in the manufacture of the components of a typical transistor also lowers the overall cost per transistor as well as the cost of integrated circuit devices incorporating such transistors.

The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, ie., local site and worldwide, monitoring. These deficiencies can engender nonoptimal control of critical processing parameters, such as throughput accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an improved monitoring and diagnostics system for such tools would provide a means of monitoring this variability, as well as providing means for optimizing control of critical parameters.

Among the parameters it would be useful to monitor and control are interlayer dielectric layer thickness variations. Typically, the total dielectric film thickness between metal layers is comprised of dielectric materials formed in two different deposition steps, e.g., a high density plasma process is used to fill the gaps between metal lines, and a silicon dioxide cap layer is formed by a deposition process using TEOS. After the insulation layers are formed, a chemical mechanical planarization process (CMP) is performed. The CMP process is performed to ensure that the proper post-polish thickness of the total dielectric material has been achieved. Chemical-mechanical planarization (CMP) is a process designed to remove and/or eliminate unwanted surface or "topographic" features of a process layer. Chemical-mechanical planarization (CMP) typically involves physically polishing the surface or "topography" of a process layer in the presence of a chemically reactive slurry to remove and/or eliminate the unwanted surface or topographic features of the process layer. Using this technique, the CMP process must account for thickness variations resulting from two deposition processes. This may result in increased use of CMP processing resources and increased manufacturing time. This may lead to inaccuracies and complications in the manufacturing processes.

The present invention is directed to overcoming, or at least reducing the effects of, one or more of the problems set forth above.

SUMMARY OF THE INVENTION

In one aspect of the present invention, a method is provided that comprises forming a first dielectric layer on a workpiece, measuring a thickness of the first dielectric layer, and forming a second dielectric layer above the first dielectric layer, the second dielectric layer being formed to a thickness that is determined based upon the measured thickness of the first dielectric layer. Other embodiments of the invention will be understood by those skilled in the art after a complete reading of the present application.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which:

FIGS. 1–2 and 8–11 schematically illustrate a flow chart for various embodiments of a method for manufacturing according to the present invention;

FIGS. 3–7 schematically illustrate formation of dielectric layers according to various illustrative embodiments of the present invention;

FIG. 12 schematically illustrates a method for fabricating a semiconductor device practiced in accordance with the present invention; and FIG. 13 schematically illustrates workpieces being processed using a processing tool, using a plurality of control input signals, in accordance with the present invention.

Figure 1:
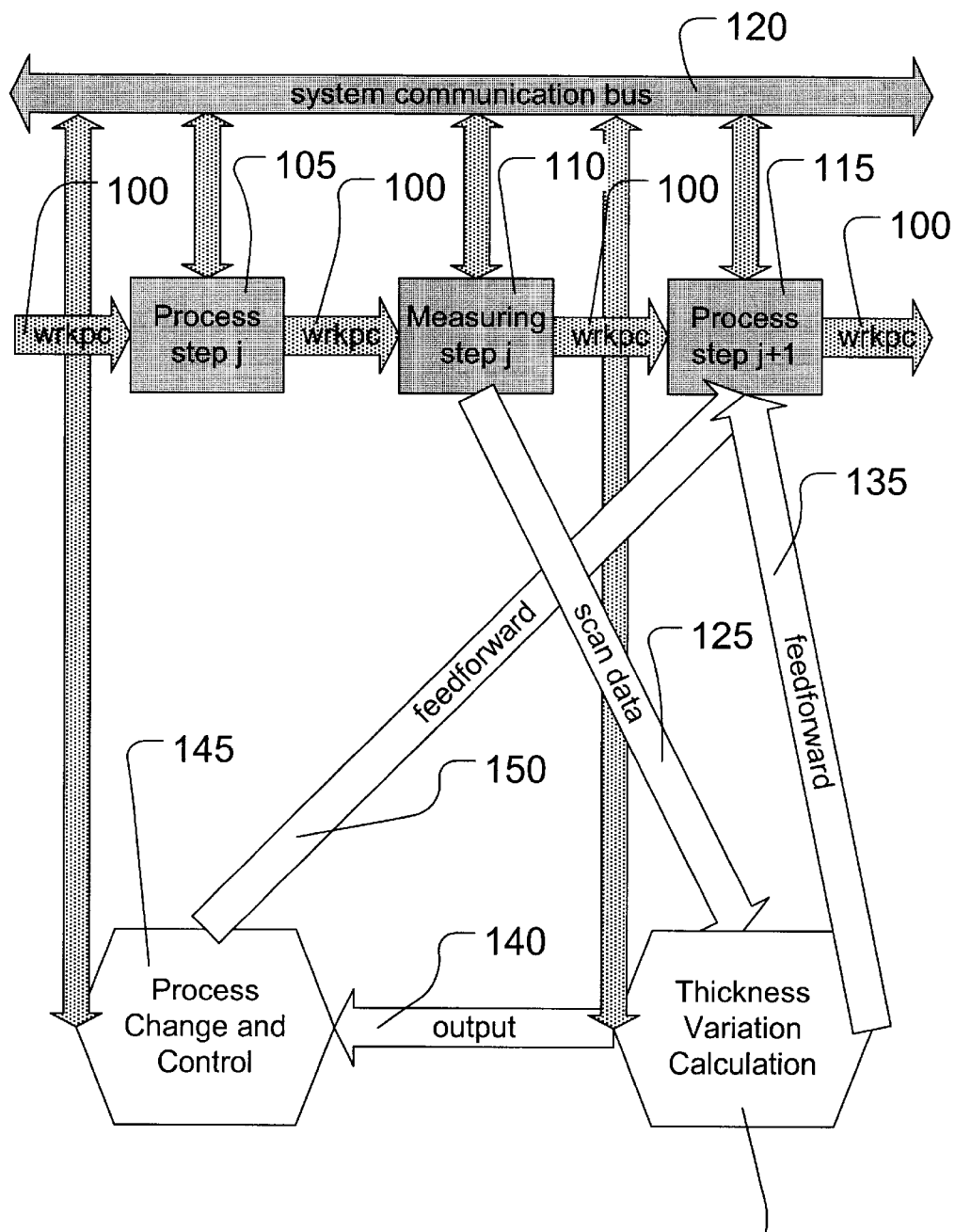
FIGS. 1–13 schematically illustrate various embodiments of a method for manufacturing according to the present invention; and, more particularly.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method for manufacturing according to the present invention are shown in FIGS. 1–13. As shown in FIG. 1, a workpiece 100, such as a semiconducting substrate or wafer, having one or more process layers and/or semiconductor devices such as an MOS transistor disposed thereon, for example, is delivered to a processing step j 105, where j may have any value from j=1 to j=N. The total number N of processing steps, such as masking, etching, depositing material and the like, used to form the finished workpiece 100, may range from N=1 to about any finite value.

In various illustrative embodiments, the processing step j 105 may involve high-density plasma deposition of an oxide (e.g., Ge oxide), a nitride (e.g., GaAs nitride), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon nitride ($Si_3N_4$), silicon oxynitride ($Si_xO_yN_z$), and the like. For example, the processing step j 105 may involve high-density plasma deposition of silicon dioxide ($SiO_2$) as a portion of an interlayer dielectric layer, filling in gaps between structures, such as metal structures (conductive interconnect lines, and the like), formed on the workpiece 100, as described more fully below in conjunction with FIGS. 3—7.

As shown in FIG. 1, a system communication bus 120 may be provided to facilitate communication between the processing step j 105, a measuring step j 110, and a further processing step j+1 115 for further processing, where j may have any value from j=1 to j=N, for a sequence of N total processing steps (when j=N, there will, of course, not be any further processing step N+1 115). Using the system communication bus 120, data and/or instructions may be exchanged between any or all of the various N processing and/or N measuring steps. In particular, using the system communication bus 120, scan data 125 from any measuring step j 110, where j may have any value from j=1 to j=N, may be exchanged between, and made available to, any or all of the various N processing and/or N measuring steps. which may, in turn, pass the scan data 125 on to any thickness variation calculation step such as a thickness variation calculation step 130. As shown in FIG. 1, the system communications bus 120 also provides communications between the processing step j 105, the measuring step j 11O and the further processing step j+1 115, and a thickness variation calculation step 130 and a process change and control step 145, more fully described below.

Figure 2:
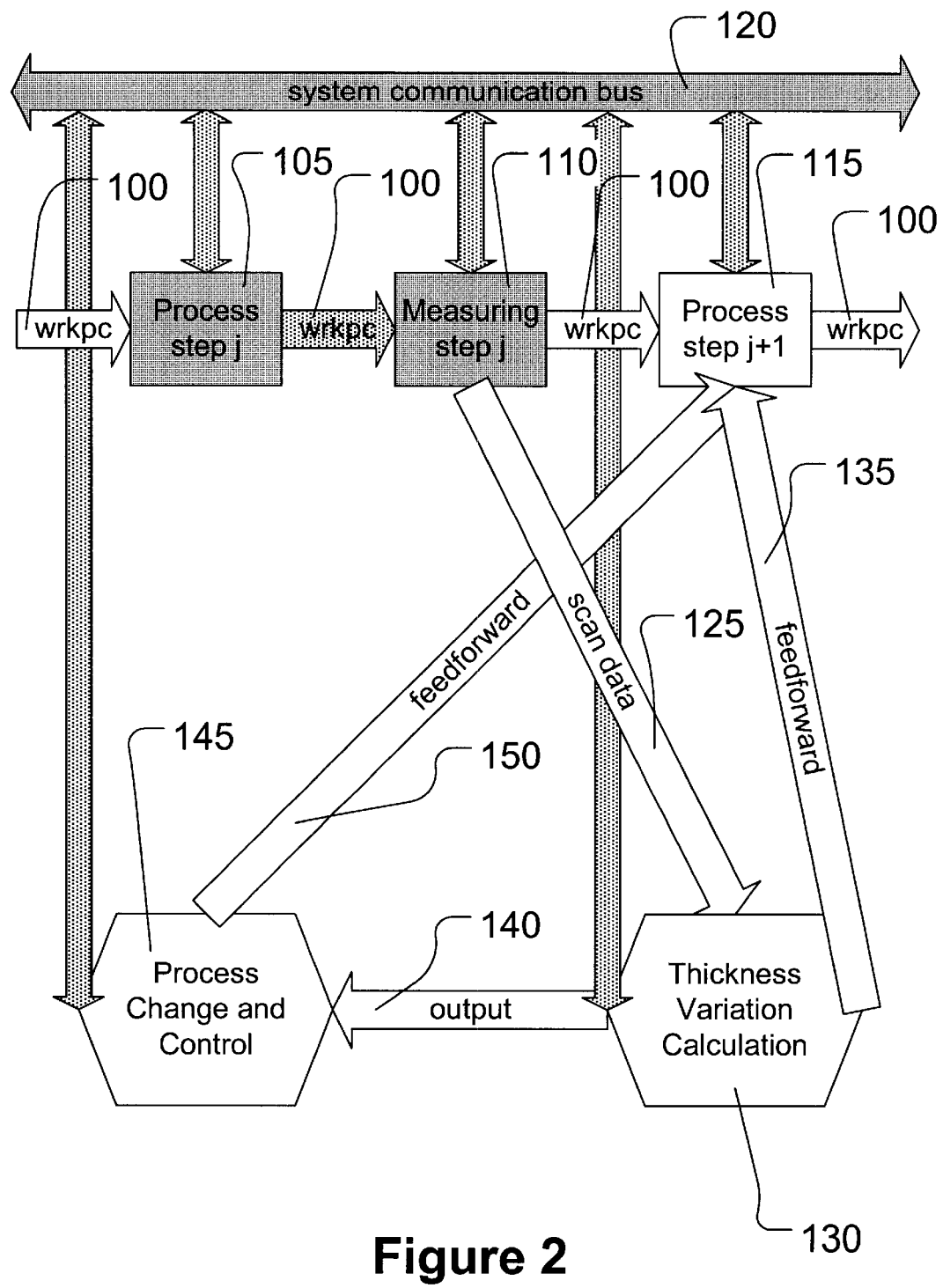

As shown in FIG. 2, the workpiece 100 is sent from the processing step j 105 and delivered to a measuring step j 110. In the measuring step j 110, the workpiece 100 is measured by having a metrology or measuring tool (not shown) measure one or more parameters characteristic of the processing performed in any of the previous processing steps (such as processing step j 105, where j may have any value. from j=1 to j=N). The measurements in the measuring step j 110 produce the scan data 125 indicative of the one or more characteristic parameters measured in the measuring step j 110. As shown in FIG. 2, if there is further processing to do on the workpiece 100 (if j<N), then the workpiece 100 may be sent from the measuring step j 110 and delivered to a processing step j+1 140 for further processing, and then sent on from the processing step j+1 140.

Figure 3:
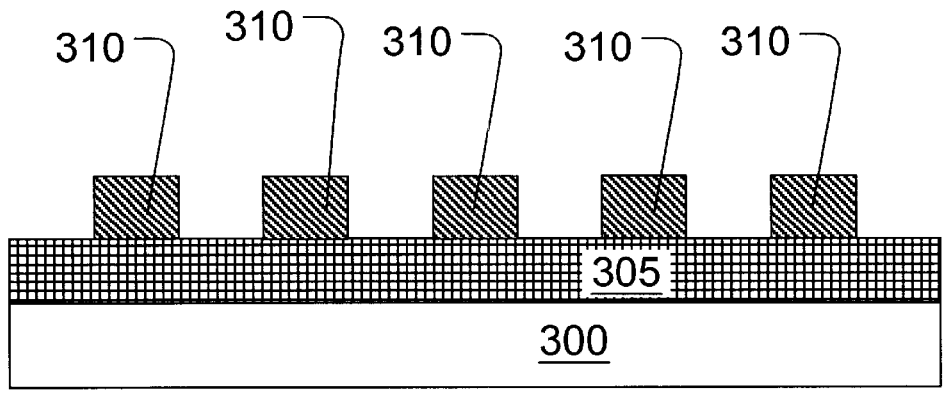

In various illustrative embodiments, there is further processing to do on the workpiece 100 (j<N) and the measuring step j 110 may be a thickness measurement of a dielectric process layer formed on the workpiece 100. FIGS. 3–7 schematically illustrate a thickness measurement for a dielectric layer that forms a portion of an interlayer dielectric layer (ILD). As shown in FIG. 3, a dielectric layer 305 may be formed above a structure layer 300, such as a semiconducting substrate (e.g., a silicon wafer). The dielectric layer 305 may be formed by a variety of known techniques for forming such layers, e.g. chemical vapor deposition (CVD), low-pressure CVD (LPCVD), plasma-enhanced CVD (PECVD), sputtering and physical vapor deposition (PVD), and the like, and may have a thickness ranging from approximately 20–5000 Å, for example.

The dielectric layer 305 may be formed from a variety of dielectric materials and may, for example, be an oxide (e.g., Ge oxide), a nitride (e.g., GaAs nitride), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon nitride ($Si_3N_4$), silicon oxynitride ($Si_xO_yN_z$), and the like. In one illustrative embodiment, the dielectric layer 305 is comprised of a silicon dioxide ($SiO_2$) having a thickness of approximately 5000 Å, which is formed by an LPCVD process.

As shown in FIG. 3, a plurality of structures 310, such as metal or polycrystalline silicon (polysilicon or poly) lines 310, may be formed above the dielectric layer 305. The structures 310 may be formed by a variety of known techniques for forming such layers, e.g., chemical vapor deposition (CVD), low-pressure CVD (LPCVD), plasma-enhanced CVD (PECVD), sputtering and physical vapor deposition (PVD), high-density plasma (HDP) deposition, and the like, and may have a thickness ranging from approximately 1000–10,000 Å. In one illustrative embodiment, the structures 310 have a thickness of approximately 5000 Å and are formed by a PVD process.

Figure 4:
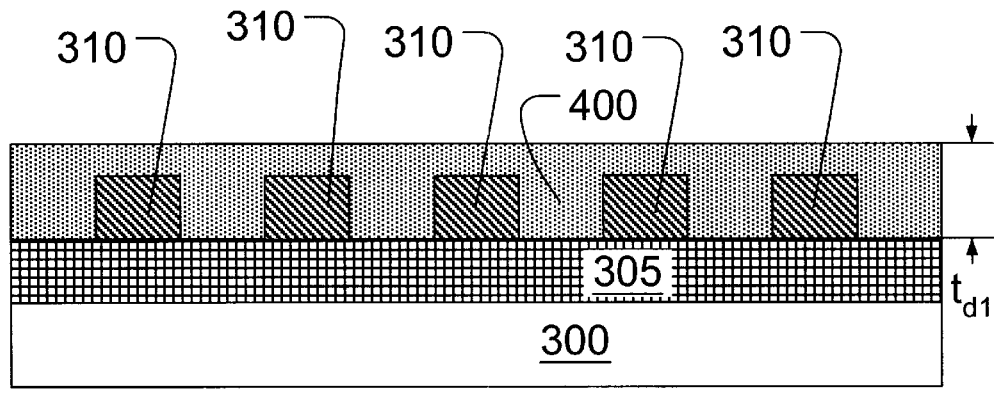
Figure 5:
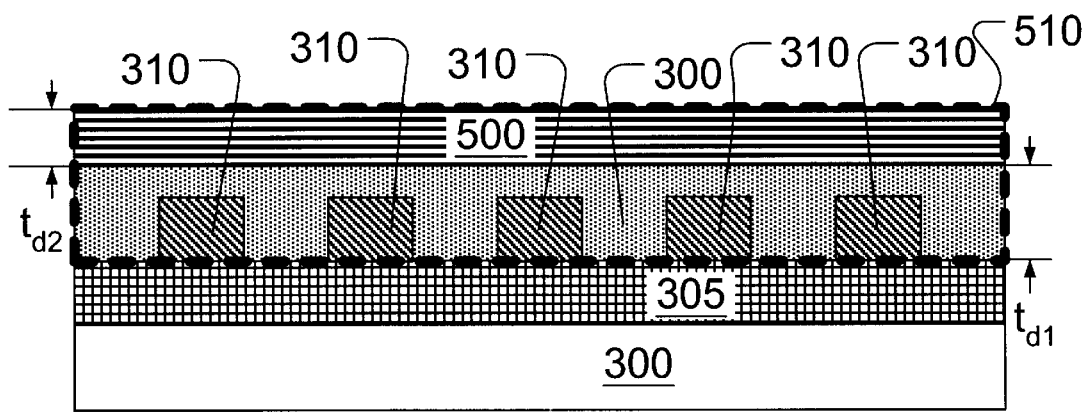

As shown in FIG. 4, a first dielectric layer 400 may be formed above the dielectric layer 305 and adjacent the structures 310. The first dielectric layer 400 may completely fill the gaps between adjacent structures 310. The first dielectric layer 400 forms a portion of an interlayer dielectric layer (ILD) 510 (indicated in phantom in FIG. 5) that comprises the first dielectric layer 400 and a second dielectric layer 500 (FIG. 5). The first dielectric layer 400 may be formed by a variety of known techniques for forming such layers, e.g., chemical vapor deposition (CVD), low-pressure CVD (LPCVD), plasma-enhanced CVD (PECVD), high-density plasma (HDP) deposition, and the like, and may have a thickness $t_{d1}$ ranging from approximately 1000–10, 000 Å, for example. The thickness tdl of the first dielectric layer 400 may be measured in the measuring step j 110 in any of a number of ways (not shown), such as by using an Optiprobe metrology tool, and the like. As shown in FIG. 4, the first dielectric layer 400 may have thickness $t_{d1}$ that is greater than (or substantially equal to) the thickness of the structures 310.

The first dielectric layer 400 may be formed from a variety of dielectric materials and may, for example, be an oxide (e.g., Ge oxide), a nitride (e.g., GaAs nitride), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon nitride ($Si_3N_4$), silicon oxynitride ($Si_xO_yN_z$), and the like. In one illustrative embodiment, the first dielectric layer 400 is comprised of a silicon dioxide ($SiO_2$) having a thickness $t_{d1}$ of approximately 6000 Å, which is formed by a high-density plasma (HDP) deposition process.

As shown in FIG. 5, a second dielectric layer 500 may be formed above the first dielectric layer 400. The second dielectric layer 500 forms another portion of the interlayer dielectric layer (ILD) 510 that comprises the first dielectric layer 400 and the second dielectric layer 500. The second dielectric layer 500 may be formed by a variety of known techniques for forming such layers, e.g., chemical vapor deposition (CVD), low-pressure CVD (LPCVD), plasma-enhanced CVD (PECVD), high-density plasma (HDP) deposition, and the like, and may have a thickness $t_{d2}$ ranging from approximately 2000–15,000 Å, for example. The interlayer dielectric layer (ILD) 510 that comprises the first dielectric layer 400 and the second dielectric layer 500 may have a total thickness approximately equal to the combined thicknesses $t_{d1}$ and $t_{d2}$, respectively, of the first dielectric layer 400 and the second dielectric layer 500. The total thickness of the interlayer dielectric layer (ILD) 510 may range from about 3000–25,000 Å, for example.

The second dielectric layer 500 may be formed from a variety of dielectric materials and may, for example, be an oxide (e.g., Ge oxide), a nitride (e.g., GaAs nitride), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon nitride ($Si_3N_4$), silicon oxynitride ($Si_xO_yN_z$), and the like. In one illustrative embodiment, the second dielectric layer 500 is comprised of silicon dioxide (formed using tetraethyl orthosilicate (TEOS)) having a thickness $t_2$ of approximately 10,000 Å, which is formed by a high-density plasma (HDP) deposition process.

Figure 6:
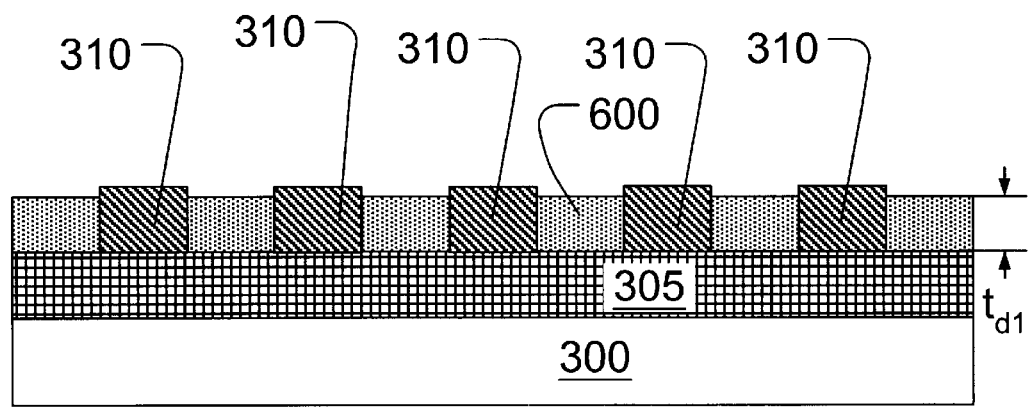
Figure 7:
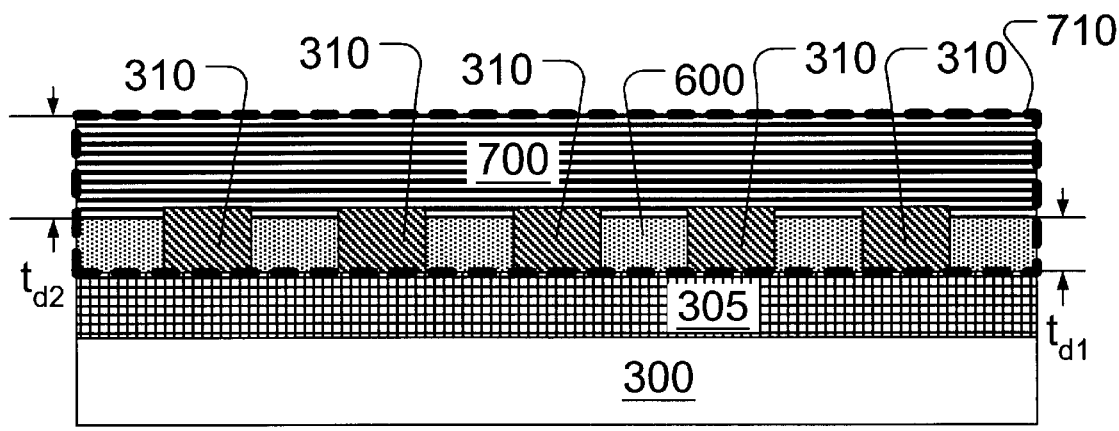

As shown in FIG. 6, in various illustrative alternative embodiments, a first dielectric layer 600 may be formed above the dielectric layer 305 and adjacent the structures 310. The first dielectric layer 600 may partially fill the gaps between adjacent structures 310. The first dielectric layer 600 forms a portion of an interlayer dielectric layer (ILD) 710 (indicated in phantom in FIG. 7) that comprises the first dielectric layer 600 and a second dielectric layer 700 (FIG. 7). The first dielectric layer 600 may be formed by a variety of known techniques for forming such layers, e.g., chemical vapor deposition (CVD), low-pressure CVD (LPCVD), plasma-enhanced CVD (PECVD), sputtering and physical vapor deposition (PVD), high-density plasma (HDP) deposition, and the like, and may have a thickness $t_{d1}$ ranging from approximately 500–8000 Å, for example. The thickness $t_{d1}$ of the first dielectric layer 400 may be measured in the measuring step j 110 in any of a number of ways (not shown), such as by using an Optiprobe metrology tool, and the like. As shown in FIG. 6, the first dielectric layer 400 may have thickness $t_{d1}$ that is less than (or substantially equal to) the thickness of the structures 310.

The first dielectric layer 600 may be formed from a variety of dielectric materials and may, for example, be an oxide (e.g., Ge oxide), a nitride (e.g., GaAs nitride), an oxynitride (e.g. GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon nitride ($Si_3N_4$), silicon oxynitride ($Si_xO_yN_z$), and the like. In one illustrative embodiment, the first dielectric layer 600 is comprised of a silicon dioxide ($SiO_2$) having a thickness $t_{d1}$ of approximately 750 Å, which is formed by a high-density plasma (HDP) deposition process.

As shown in FIG. 7, a second dielectric layer 700 may be formed above the first dielectric layer 600. The second dielectric layer 700 forms another portion of the interlayer dielectric layer (ILD) 710 that comprises the first dielectric layer 400 and the second dielectric layer 500. The second dielectric layer 500 may be formed by a variety of known techniques for forming such layers, e.g., chemical vapor deposition (CVD), low-pressure CVD (LPCVD), plasma-enhanced CVD (PECVD), sputtering and physical vapor deposition (PVD), high-density plasma (HDP) deposition, and the like, and may have a thickness $t_{d2}$ ranging from approximately 1000–6000 Å, for example. The interlayer dielectric layer (ILD) 710 that comprises the first dielectric layer 600 and the second dielectric layer 700 may have a total thickness approximately equal to the combined thicknesses $t_{d1}$ and $t_{d2}$, respectively, of the first dielectric layer 600 and the second dielectric layer 700. The total thickness of the interlayer dielectric layer (ILD) 710 may range from about 1500–14,000 Å, for example.

The second dielectric layer 700 may be formed from a variety of dielectric materials and may, for example, be an oxide (e.g., Ge oxide), a nitride (e.g., GaAs nitride), an oxynitride (eg., GaP oxynitride), silicon dioxide ($SiO_2$), a nitrogen-bearing oxide (e.g., nitrogen-bearing $SiO_2$), a nitrogen-doped oxide (e.g. $N_2$-implanted $SiO_2$), silicon nitride ($Si_3N_4$), silicon oxynitride ($Si_xO_yN_z$), and the like. In one illustrative alternative embodiment, the second dielectric layer 700 is comprised of silicon dioxide having a thickness $t_{d2}$ of approximately 2500 Å, which is formed by a PECVD process.

Figure 8:
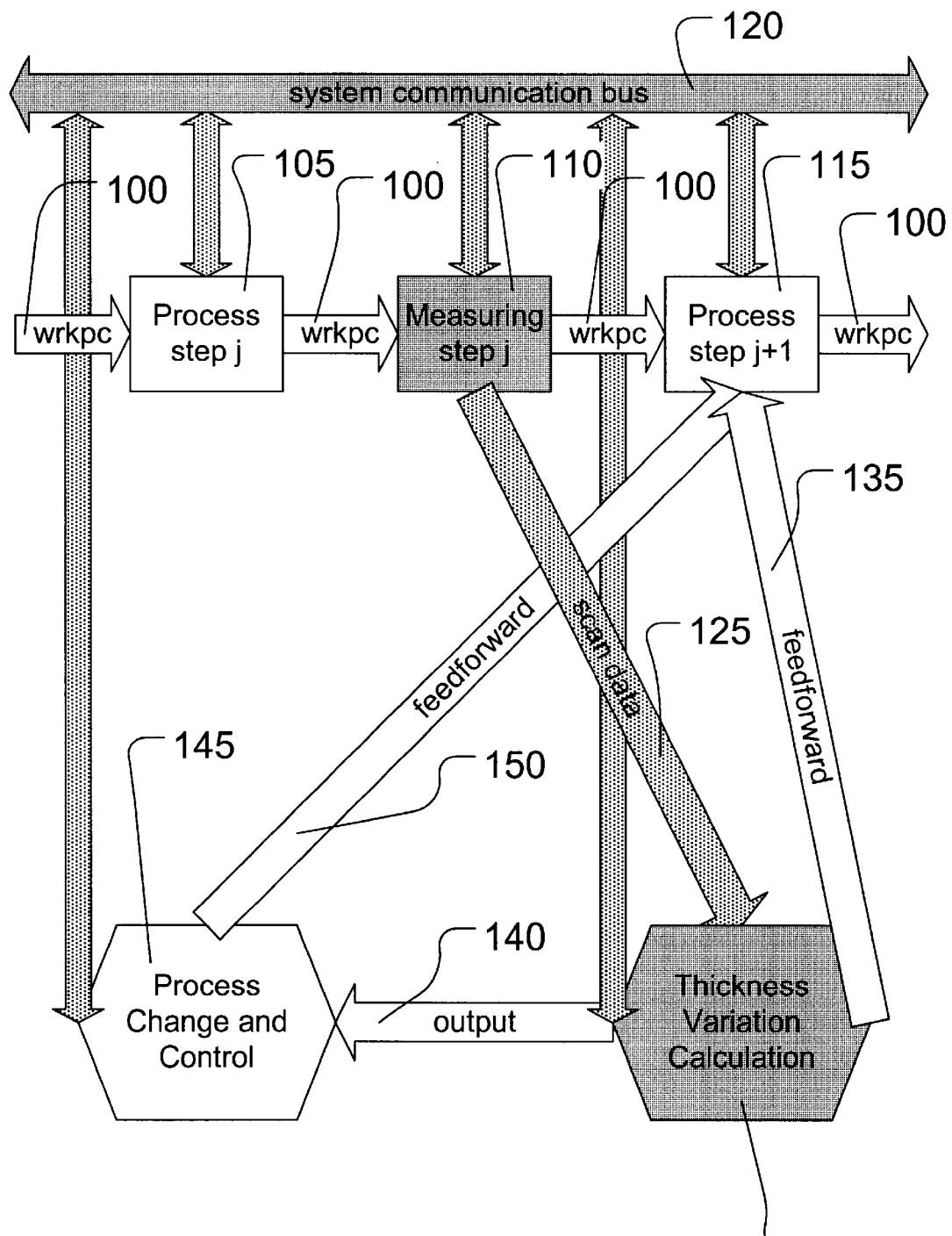

As shown in FIG. 8, the scan data 125 is sent from the measuring step j 110 and delivered to a thickness variation calculation step 130. In the thickness variation calculation step 130, the thickness $t_{d1}$ of the first dielectric layer 400 measured in the measuring step j 110 may be input into a thickness variation calculation model. The thickness variation calculation model may calculate the variation of the thickness $t_{d1}$ of the first dielectric layer 400 measured in the measuring step j 110 with respect to a target thickness for the first dielectric layer 400. Delivering the scan data 125 to the thickness variation calculation step 130 produces an output signal 140. As shown in FIG. 8, using the system communication bus 120, scan data 125 from the measuring step j 110, where j may have any value from j=1 to j=N, may be exchanged between, and made available to, any or all of the various N processing and/or N measuring steps.

The thickness variation calculation of the thickness $t_{d1}$ of the first dielectric layer 400 measured in the measuring step j 110 with respect to a target thickness for the first dielectric layer 400, performed in the thickness variation calculation step 130, may be used to adjust the processing performed any of the previous and/or subsequent processing steps (such as processing step j 105, where j may have any value from j=1 to j=N). For example, an adjustment may be made to the target thickness for the first dielectric layer 400, affecting the output signal 140 produced.

Figure 9:
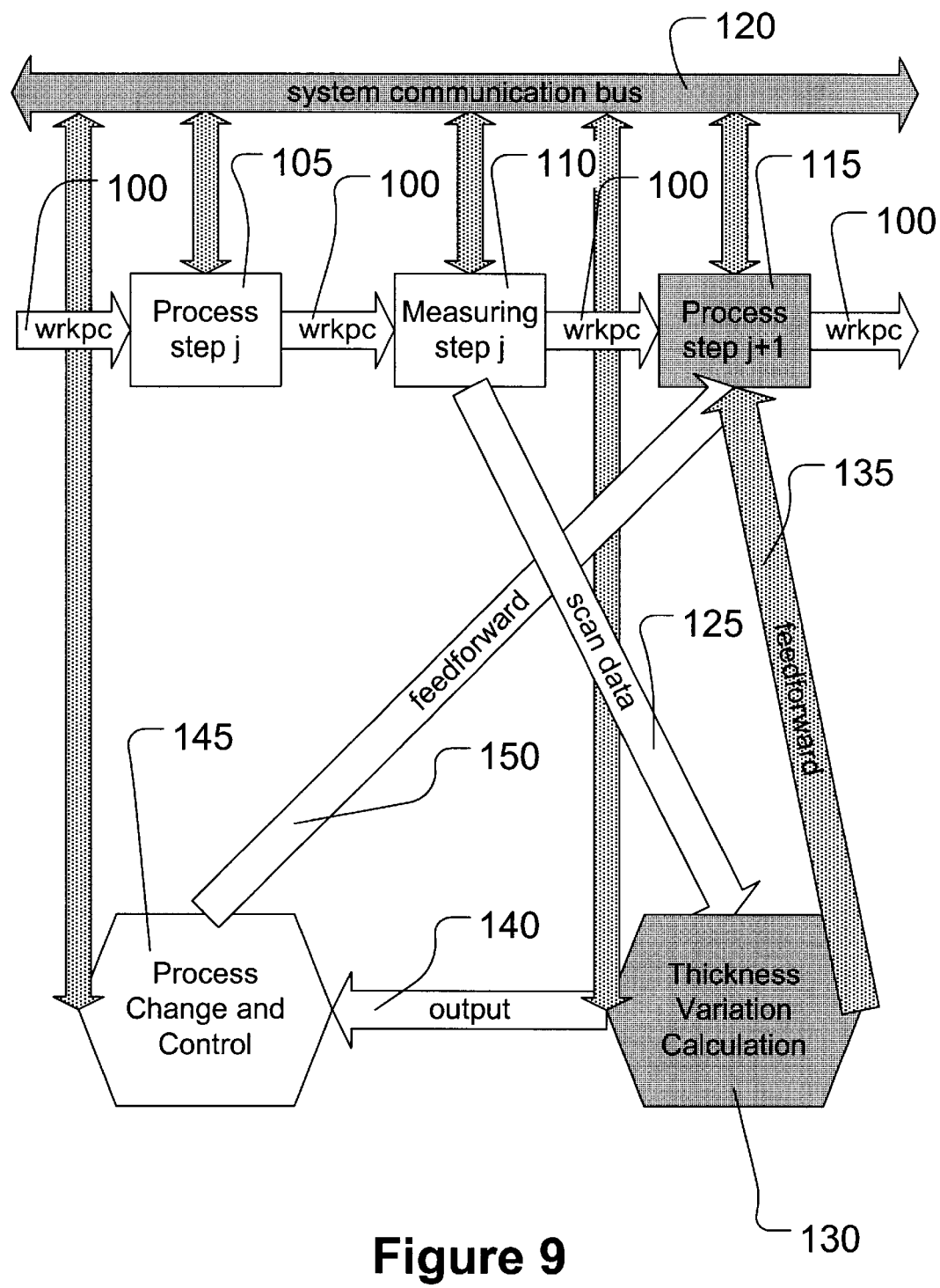

As shown in FIG. 9, a feedforward control signal 135 may be sent from the thickness variation calculation step 130 to the processing step j 115 to adjust the processing performed in the processing step j 115. For example, depending on the thickness variation calculation of the thickness $t_{d1}$ of the first dielectric layer 400 and the desired total thickness of the interlayer dielectric layer (ILD) 510, the feedforward control signal 135 may be sent from the thickness variation calculation step 130 to the processing step j 115 to adjust the processing performed in the processing step j 115 so that the thickness $t_{d2}$ of the second dielectric layer 500 may be appropriate.

The total thickness of the interlayer dielectric layer (ILD) 510, approximately equal to the combined thicknesses $t_{d1}$ and $t_{d2}$, respectively, of the first dielectric layer 400 and the second dielectric layer 500, will then better match the desired total thickness of the interlayer dielectric layer (ILD) 510. Achieving a better match to the desired total thickness of the interlayer dielectric layer (ILD) 510 means that subsequent planarization of the interlayer dielectric layer (ILD) 510 may involve the removal of much less dielectric material, during a chemical-mechanical planarization (CMP), for example, than in conventional interlayer dielectric layer (ILD) formation processes. In various alternative illustrative embodiments (not shown), the feedforward control signal 135 may be sent, using the system communication bus 120, for example, from the thickness variation calculation step 130 to any of the previous and/or subsequent processing steps (similar to processing step j 105, where j may have any value from j=1 to j=N) to adjust the processing performed in any of the previous and/or subsequent processing steps.

Figure 10:
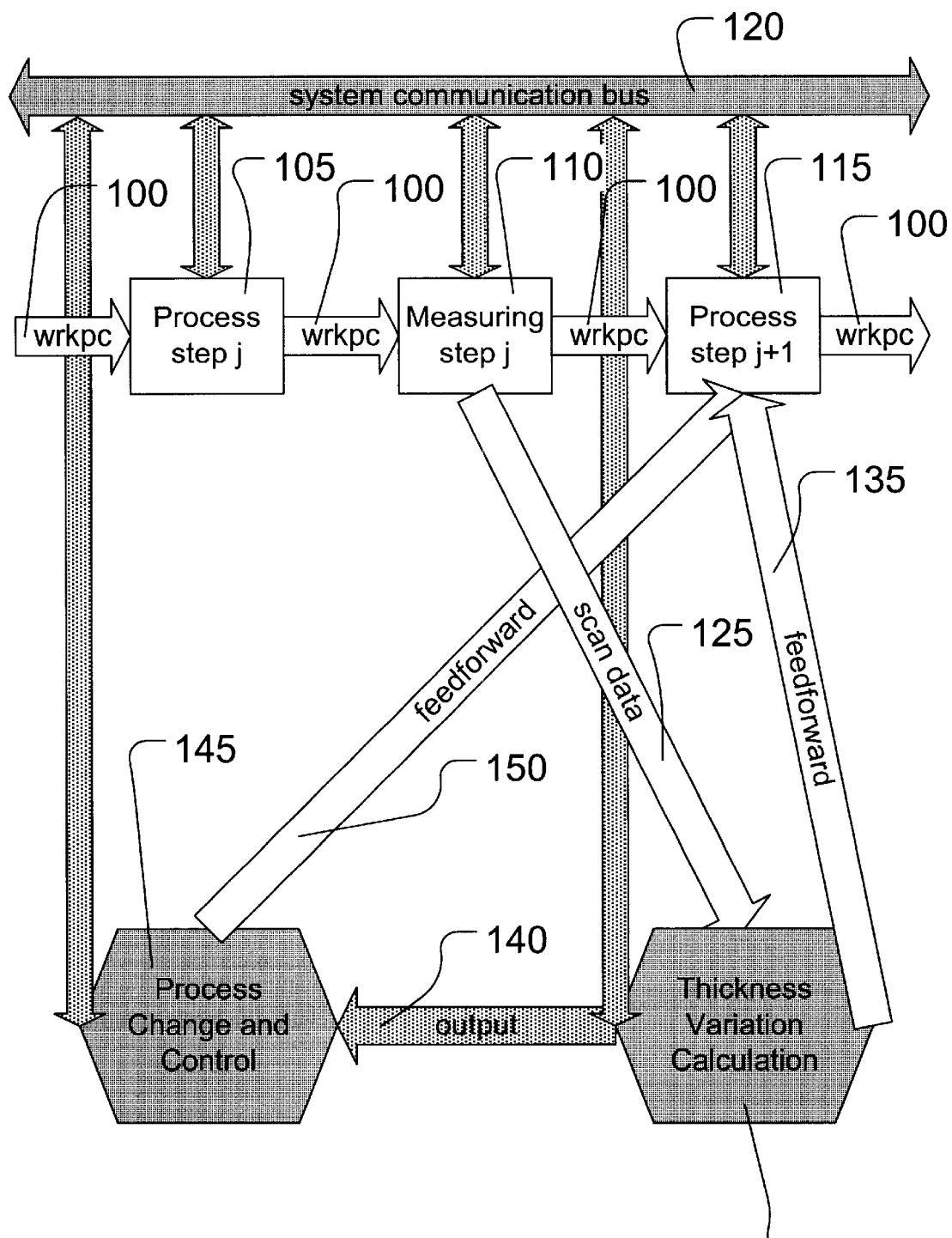
Figure 11:
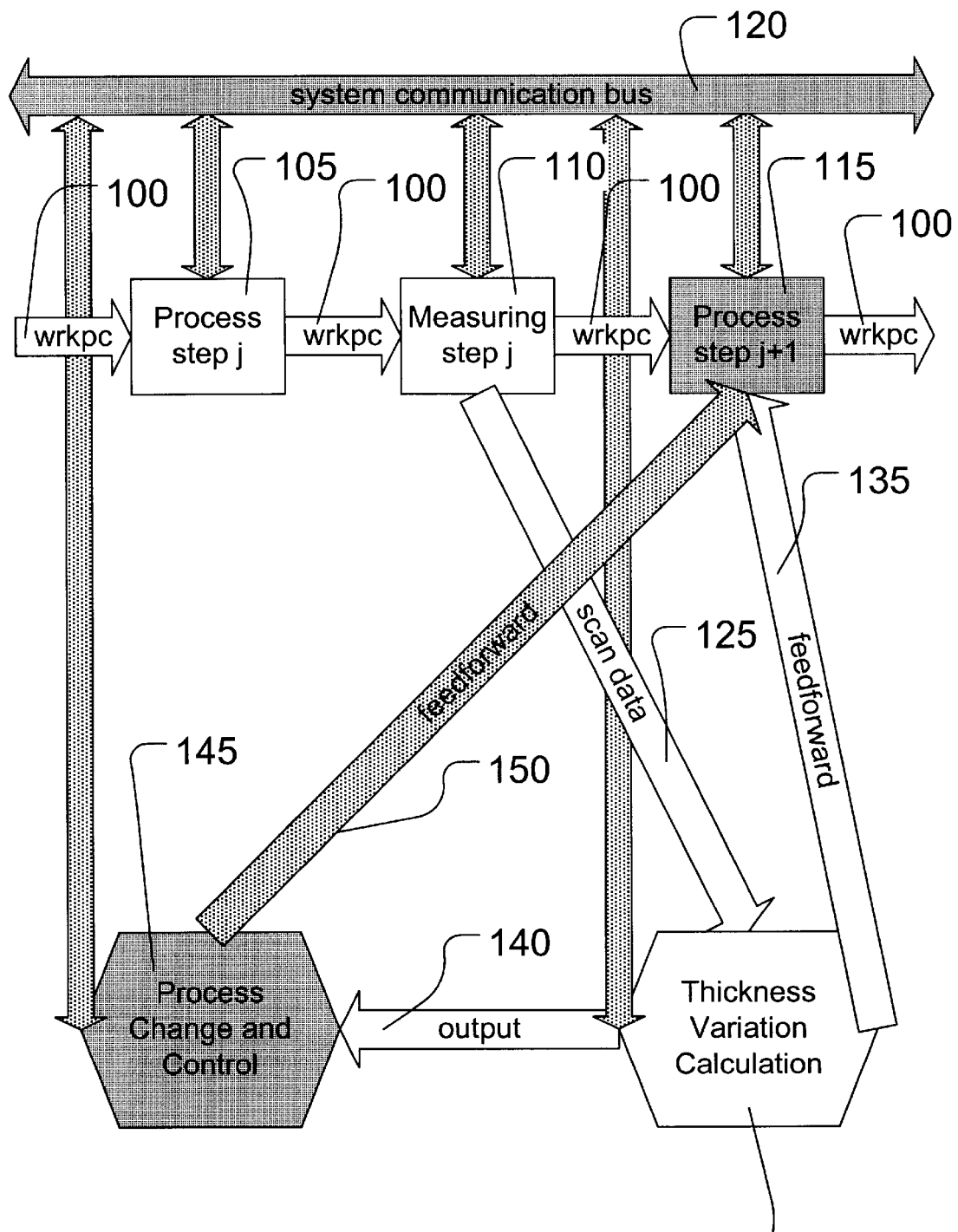

As shown in FIG. 10, in addition to, and/or instead of, the feedforward control signal 135, the output signal 140 may be sent from the thickness variation calculation step 130 and delivered to a process change and control step 145. In the process change and control step 145, the output signal 140 may be used in a high-level supervisory control loop. Thereafter, as shown in FIG. 11, a feedforward control signal 150 may be sent from the process change and control step 145 to the processing step j 115 to adjust the processing performed in the processing step j 115. For example, depending on the thickness variation calculation of the thickness $t_{d1}$ of the first dielectric layer 400 and the desired total thickness of the interlayer dielectric layer (ILD) 510, the feedforward control signal 150 may be sent from the process change and control step 145 to the processing step j 115 to adjust the processing performed in the processing step j 115 so that the thickness $t_{d2}$ of the second dielectric layer 500 may be appropriate.

The total thickness of the interlayer dielectric layer (ILD) 510, approximately equal to the combined thicknesses $t_{d1}$ and $t_{d2}$, respectively, of the first dielectric layer 400 and the second dielectric layer 500, will then better match the desired total thickness of the interlayer dielectric layer (ILD) 510. Achieving a better match to the desired total thickness of the interlayer dielectric layer (ILD) 510 means that subsequent planarization of the interlayer dielectric layer (ILD) 510 may involve the removal of much less dielectric material, during a chemical-mechanical planarization (CMP), for example, than in conventional interlayer dielectric layer (ILD) formation processes. In various alternative illustrative embodiments (not shown), the feedforward control signal 150 may be sent, using the system communication bus 120, for example, from the process change and control step 150 to any of the previous and/or subsequent processing steps (similar to processing step j 105, where j may have any value from j=1 to j=N) to adjust the processing performed in any of the previous and/or subsequent processing steps.

As shown in FIG. 8, in various illustrative alternative embodiments, the scan data 125 is sent from the measuring step j 110 and delivered to a thickness variation calculation step 130. In the thickness variation calculation step 130, the thickness $t_{d1}$ of the first dielectric layer 600 measured in the measuring step j 110 may be input into a thickness variation calculation model. The thickness variation calculation model may calculate the variation of the thickness $t_{d1}$ of the first dielectric layer 600 measured in the measuring step j 110 with respect to a target thickness for the first dielectric layer 600. Delivering the scan data 125 to the thickness variation calculation step 130 produces an output signal 140. As shown in FIG. 8, using the system communication bus 120, scan data 125 from the measuring step j 110, where j may have any value from j=1 to j=N, may be exchanged between, and made available to, any or all of the various N processing and/or N measuring steps.

The thickness variation calculation of the thickness $t_{d1}$ of the first dielectric layer 600 measured in the measuring step j 110 with respect to a target thickness for the first dielectric layer 600, performed in the thickness variation calculation step 130, may be used to alert an engineer of the need to adjust the processing performed any of the previous and/or subsequent processing steps (such as processing step j 105, where j may have any value from j=1 to j=N). The engineer may also alter, for example, the target thickness for the first dielectric layer 600, affecting the output signal 140 produced.

As shown in FIG. 9, a feedforward control signal 135 may be sent from the thickness variation calculation step 130 to the processing step j 115 to adjust the processing performed in the processing step j 115. For example, depending on the thickness variation calculation of the thickness $t_{d1}$ of the first dielectric layer 600 and the desired total thickness of the interlayer dielectric layer (ILD) 710, the feedforward control signal 135 may be sent from the thickness variation calculation step 130 to the processing step j 115 to adjust the processing performed in the processing step j 115 so that the thickness $t_{d2}$ of the second dielectric layer 700 may be appropriate.

The total thickness of the interlayer dielectric layer (ILD) 710, approximately equal to the combined thicknesses $t_{d1}$ and $t_{d2}$, respectively, of the first dielectric layer 600 and the second dielectric layer 700, will then better match the desired total thickness of the interlayer dielectric layer (ILD) 710. Achieving a better match to the desired total thickness of the interlayer dielectric layer (ILD) 710 means that subsequent planarization of the interlayer dielectric layer (ILD) 710 may involve the removal of much less dielectric material, during a chemical-mechanical planarization (CMP), for example, than in conventional interlayer dielectric layer (ILD) formation processes. In various alternative illustrative embodiments (not shown), the feedforward control signal 135 may be sent, using the system communication bus 120, for example, from the thickness variation calculation step 130 to any of the previous and/or subsequent processing steps (similar to processing step j 105, where j may have any value from j=1 to j=N) to adjust the processing performed in any of the previous and/or subsequent processing steps.

As shown in FIG. 10, in addition to, and/or instead of, the feedforward control signal 135, the output signal 140 may be sent from the thickness variation calculation step 130 and delivered to a process change and control step 145. In the process change and control step 145, the output signal 140 may be used in a high-level supervisory control loop. Thereafter, as shown in FIG. 11, a feedforward control signal 150 may be sent from the process change and control step 145 to the processing step j 115 to adjust the processing performed in the processing step j 115. For example, depending on the thickness variation calculation of the thickness $t_{d1}$ of the first dielectric layer 600 and the desired total thickness of the interlayer dielectric layer (ILD) 710, the feedforward control signal 150 may be sent from the process change and control step 145 to the processing step j 115 to adjust the processing performed in the processing step j 115 so that the thickness $t_{d2}$ of the second dielectric layer 700 may be appropriate.

The total thickness of the interlayer dielectric layer (ILD) 710, approximately equal to the combined thicknesses $t_{d1}$ and $t_{d2}$, respectively, of the first dielectric layer 600 and the second dielectric layer 700, will then better match the desired total thickness of the interlayer dielectric layer (ILD) 710. Achieving a better match to the desired total thickness of the interlayer dielectric layer (ILD) 710 means that subsequent planarization of the interlayer dielectric layer (ILD) 710 may involve the removal of much less dielectric material, during a chemical-mechanical planarization (CMP), for example, than in conventional interlayer dielectric layer (ILD) formation processes. In various alternative illustrative embodiments (not shown), the feedforward control signal 150 may be sent, using the system. communication bus 120, for example, from the process change and control step 150 to any of the previous and/or subsequent processing steps (similar to processing step j 105, where j may have any value from j=1 to j=N) to adjust the processing performed in any of the previous and/or subsequent processing steps.

In various illustrative embodiments, the engineer may be provided with advanced process data monitoring capabilities, such as the ability to provide historical parametric data in a user-friendly format, as well as event logging, real-time graphical display of both current processing parameters and the processing parameters of the entire run, and remote, i e., local site and worldwide, monitoring. These capabilities may engender more optimal control of critical processing parameters, such as throughput accuracy, stability and repeatability, processing temperatures, mechanical tool parameters, and the like. This more optimal control of critical processing parameters reduces this variability. This reduction in variability manifests itself as fewer within-run disparities, fewer run-to-run disparities and fewer tool-to-tool disparities. This reduction in the number of these disparities that can propagate means fewer deviations in product quality and performance. In such an illustrative embodiment of a method of manufacturing according to the present invention, a monitoring and diagnostics system may be provided that monitors this variability and optimizes control of critical parameters.

Figure 12:
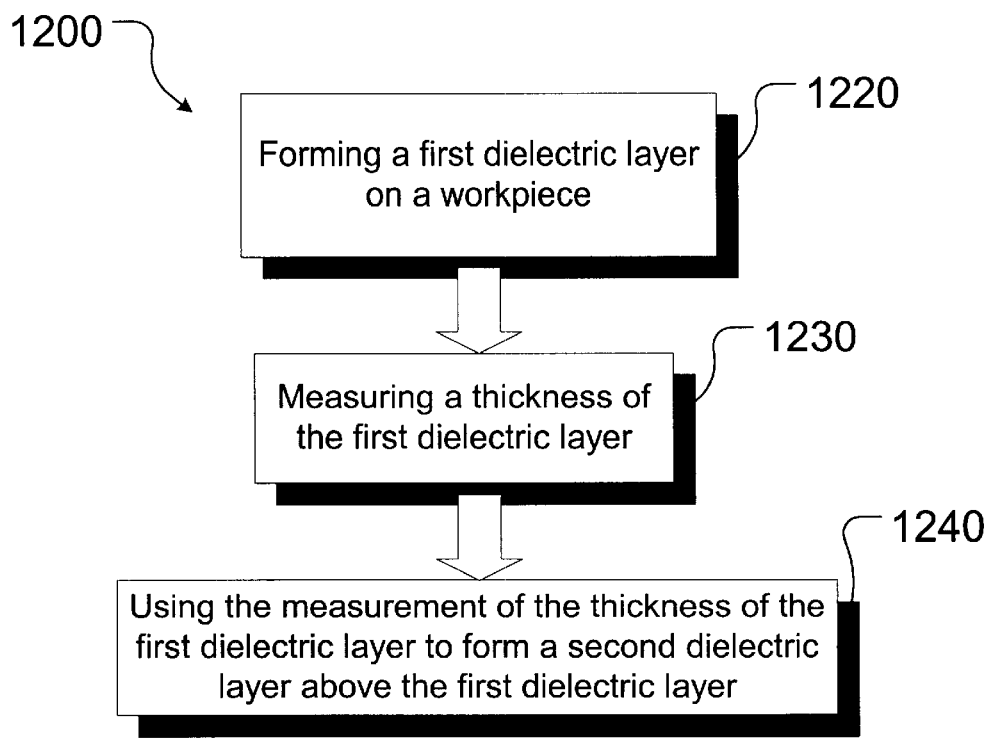
Figure 13:
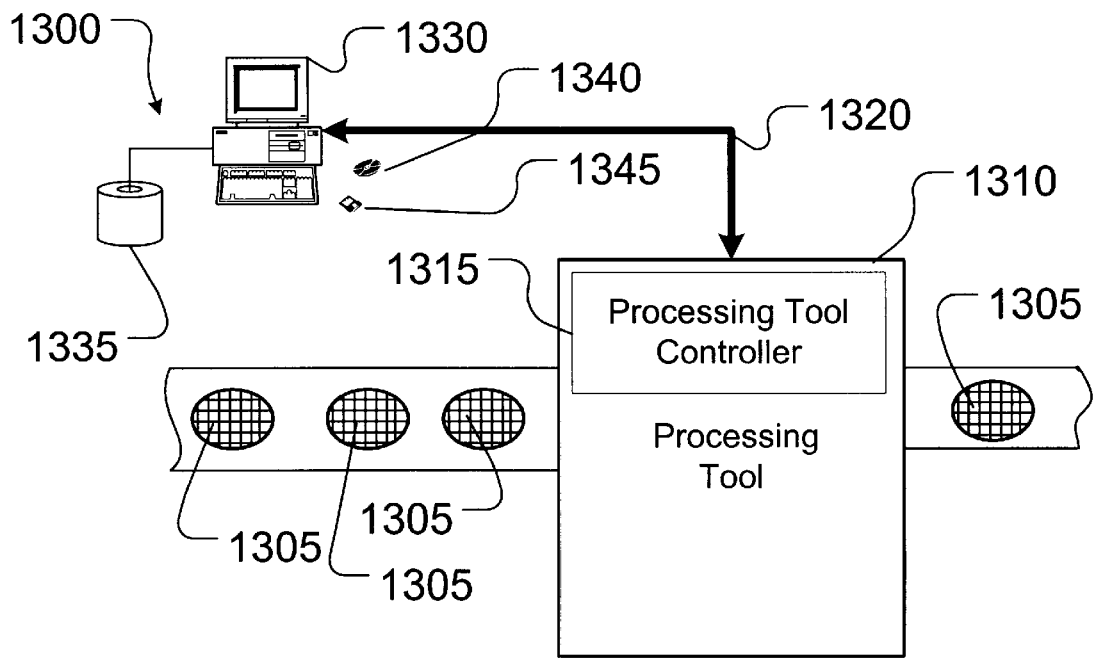

FIG. 12 illustrates one particular embodiment of a method 1200 practiced in accordance with the present invention. FIG. 13 illustrates one particular apparatus 1300 with which the method 1200 may be practiced. For the sake of clarity, and to further an understanding of the invention, the method 1200 shall be disclosed in the context of the apparatus 1300. However, the invention is not so limited and admits wide variation, as is discussed further below.

Referring now to both FIGS. 12 and 13, a batch or lot of workpieces or wafers 1305 is being processed through a processing tool 1310. The processing tool 1310 may be any processing tool known to the art, provided it comprises the requisite control capabilities. The processing tool 1310 comprises a processing tool controller 1315 for this purpose. The nature and function of the processing tool controller 1315 will be implementation specific. For example, in various illustrative embodiments, the processing tool 1310 may be a silicon dioxide high-density plasma (HDP) deposition tool. For instance, a deposition tool controller 1315 may control input parameters such as deposition time, RF power, and the like. These control input parameters will, in turn, control the thickness $t_{d2}$ of the second dielectric layer 500 (FIG. 5) and/or the second dielectric layer 700 (FIG. 7). In various illustrative alternative embodiments, for example, the processing tool 1310 may be a silicon dioxide ($SiO_2$) CVD/PECVD deposition tool. Four workpieces 1305 are shown in FIG. 13, but the lot of workpieces or wafers, i.e., the "wafer lot," may be any practicable number of wafers from one to any finite number.

The method 1200 begins, as set forth in box 1220, by forming a first dielectric layer on a workpiece 1305 in the processing tool 1310, which is a silicon dioxide ($SiO_2$) high-density plasma (HDP) deposition tool, in various illustrative embodiments. The nature, identity, and measurement of parameters characteristic of the processing performed in the processing tool 1310 will be largely implementation specific and even tool specific. For instance, capabilities for monitoring process parameters vary, to some degree, from tool to tool. Greater sensing capabilities may permit wider latitude in the characteristic parameters that are identified and measured and the manner in which this is done. Conversely, lesser sensing capabilities may restrict this latitude.

As shown in FIG. 12, once the characteristic parameter is identified and measured, the method 1200 proceeds by measuring a thickness of the first dielectric layer, as set forth in box 1230. For example, a metrology tool (not shown) may measure the thickness $t_{d1}$ of the first dielectric layer 400 (FIG. 4) and/or the first dielectric layer 600 (FIG. 6) on a workpiece 1305, and/or an average of the thicknesses $t_{d1}$ of the first dielectric layers of two or more of the workpieces 1305 in a lot, using a metrology tool (not shown), and this metrology tool may vary from wafer to wafer depending on the ambient temperature of the wafer(s). The metrology tool typically does not feedback the first dielectric layer thickness information to the first dielectric layer processing tool 1310. The first dielectric layer thickness information of a workpiece 1305, and/or an average of the first dielectric layer thicknesses of the workpieces 1305 in a lot, is an illustrative example of a parameter characteristic of the processing performed on the workpiece in the processing tool 1310. The computer system 1330 in FIG. 13 is, in this particular embodiment, programmed to calculate and/or model variations in the first dielectric layer thickness, as compared with one or more target values. The manner in which this calculating and/or modeling occurs will be implementation specific.

Turning to FIG. 13, in this particular embodiment, the parameters characteristic of the processing performed in the processing tool 1310 are measured and/or monitored by tool sensors (not shown). The outputs of these tool sensors are transmitted to a computer system 1330 over a line 1320. The computer system 1330 analyzes these sensor outputs to identify the characteristic parameters.

In the embodiment of FIG. 13, a database 1335 stores a plurality of models that might potentially be applied, depending upon which characteristic parameter is identified. This particular embodiment, therefore, requires some a priori knowledge of the characteristic parameters that might be measured. The computer system 1330 then extracts an appropriate model from the database 1335 of potential models to apply to the identified characteristic parameters. If the database 1335 does not comprise an appropriate model, then the characteristic teristic parameter may be ignored, or the computer system 1330 may attempt to develop one, if so programmed. The database 1335 may be stored on any kind of computer-readable, program storage medium, such as an optical disk 1340, a floppy disk 1345, or a hard disk drive (not shown) of the computer system 1330. The database 1335 may also be stored on a separate computer system (not shown) that interfaces with the computer system 1330.

Modeling of the identified characteristic parameter may be implemented differently in alternative embodiments. For instance, the computer system 1330 may be programmed using some form of artificial intelligence to analyze the sensor outputs and controller inputs to develop a model on-the-fly in a real-time implementation. This approach might be a useful adjunct to the embodiment illustrated in FIG. 13, and discussed above, where characteristic parameters are measured and identified for which the database 1335 has no appropriate model.

The method 1200 of FIG. 12 then proceeds by using the measurement of the thickness of the first dielectric layer to form a second dielectric layer above the first dielectric layer, as set forth in box 1240. Depending on the implementation, applying the measurement of the thickness of the first dielectric layer and/or the appropriate thickness model may yield either a new value for the control input parameter or a correction to the existing control input parameter for the deposition tool 1310 that is used to form the second dielectric layer. The new control input is then formulated from the value yielded by the thickness variation calculation and/or model and is transmitted to the deposition tool controller 1315 over the line 1320. The processing tool controller 1315 then controls subsequent processing operations in accordance with the new control inputs.

For example, as shown in FIG. 9, described above, a feedforward control signal 135 may be sent from the thickness variation calculation step 130 to the processing step j 115 to adjust the processing performed in the processing step j 115. For example, depending on the thickness variation calculation of the thickness $t_{d1}$ of the first dielectric layer 400 and the desired total thickness of the interlayer dielectric layer (ILD) 510, the feedforward control signal 135 may be sent from the thickness variation calculation step 130 to the processing step j 115 to adjust the processing performed in the processing step j 115 so that the thickness $t_{d2}$ of the second dielectric layer 500 may be appropriate.

The total thickness of the interlayer dielectric layer (ILD) 510, approximately equal to the combined thicknesses $t_{d1}$ and $t_{d2}$, respectively, of the first dielectric layer 400 and the second dielectric layer 500, will then better match the desired total thickness of the interlayer dielectric layer (ILD) 510. Achieving a better match to the desired total thickness of the interlayer dielectric layer (ILD) 510 means that subsequent planarization of the interlayer dielectric layer (ILD) 510 may involve the removal of much less dielectric material, during a chemical-mechanical planarization (CMP), for example, than in conventional interlayer dielectric layer (ILD) formation processes. In various alternative illustrative embodiments (not shown), the feedforward control signal 135 may be sent, using the system communication bus 120, for example, from the thickness variation calculation step 130 to any of the previous and/or subsequent processing steps (similar to processing step j 105, where j may have any value from j=1 to j=N) to adjust the processing performed in any of the previous and/or subsequent processing steps.

As shown in FIG. 10, in addition to, and/or instead of, the feedforward control signal 135, the output signal 140 may be sent from the thickness variation calculation step 130 and delivered to a process change and control step 145. In the process change and control step 145, the output signal 140 may be used in a high-level supervisory control loop. Thereafter, as shown in FIG. 11, a feedforward control signal 150 may be sent from the process change and control step 145 to the processing step j 115 to adjust the processing performed in the processing step j 115. For example, depending on the thickness variation calculation of the thickness $t_{d1}$ of the first dielectric layer 400 and the desired total thickness of the interlayer dielectric layer (ILD) 510, the feedforward control signal 150 may be sent from the process change and control step 145 to the processing step j 115 to adjust the processing performed in the processing step j 115 so that the thickness $t_{d2}$ of the second dielectric layer 500 maybe appropriate.

Similarly, also as shown in FIG. 9, described above, a feedforward control signal 135 may be sent from the thickness variation calculation step 130 to the processing step j 115 to adjust the processing performed in the processing step j 115. For example, depending on the thickness variation calculation of the thickness $t_{d1}$ of the first dielectric layer 600 and the desired total thickness of the interlayer dielectric layer (ILD) 510, the feedforward control signal 135 may be sent from the thickness variation calculation step 130 to the processing step j 115 to adjust the processing performed in the processing step j 115 so that the thickness $t_{d2}$ of the second dielectric layer 700 may be appropriate.

The total thickness of the interlayer dielectric layer (ILD) 710, approximately equal to the combined thicknesses $t_{d1}$ and $t_{d2}$, respectively, of the first dielectric layer 600 and the second dielectric layer 700, will then better match the desired total thickness of the interlayer dielectric layer (ILD) 710. Achieving a better match to the desired total thickness of the interlayer dielectric layer (ILD) 710 means that subsequent planarization of the interlayer dielectric layer (ILD) 710 may involve the removal of much less dielectric material, during a chemical-mechanical planarization (CMP), for example, than in conventional interlayer dielectric layer (ILD) formation processes. In various alternative illustrative embodiments (not shown), the feedforward control signal 135 may be sent, using the system communication bus 120, for example, from the thickness variation calculation step 130 to any of the previous and/or subsequent processing steps (similar to processing step j 105, where j may have any value from j=1 to j=N) to adjust the processing performed in any of the previous and/or subsequent processing steps.

As shown in FIG. 10, in addition to, and/or instead of, the feedforward control signal 135, the output signal 140 may be sent from the thickness variation calculation step 130 and delivered to a process change and control step 145. In the process change and control step 145, the output signal 140 may be used in a high-level supervisory control loop. Thereafter, as shown in FIG. 11, a feedforward control signal 150 may be sent from the process change and control step 145 to the processing step j 115 to adjust the processing performed in the processing step j 115. For example, depending on the thickness variation calculation of the thickness $t_{d1}$ of the first dielectric layer 600 and the desired total thickness of the interlayer dielectric layer (ILD) 710, the feedforward control signal 150 may be sent from the process change and control step 145 to the processing step j 115 to adjust the processing performed in the processing step j 115 so that the thickness $t_{d2}$ of the second dielectric layer 700 may be appropriate.

Some alternative embodiments may employ a form of feedback to improve the modeling of characteristic parameters. The implementation of this feedback is dependent on several disparate facts, comprising the tool's sensing capabilities and economics. One technique for doing this would be to monitor at least one effect of the model's implementation and update the model based on the effect(s) monitored. The update may also depend on the model. For instance, a linear model may require a different update than would a non-linear model, all other factors being the same.

As is evident from the discussion above, some features of the present invention are implemented in software. For instance, the acts set forth in the boxes 1220–1240 in FIG. 12 are, in the illustrated embodiment, software-implemented, in whole or in part. Thus, some features of the present invention are implemented as instructions encoded on a computer-readable, program storage medium. The program storage medium may be of any type suitable to the particular implementation. However, the program storage medium will typically be magnetic, such as the floppy disk 1345 or the computer 1330 hard disk drive (not shown), or optical, such as the optical disk 1340. When these instructions are executed by a computer, they perform the disclosed functions. The computer may be a desktop computer, such as the computer 1330. However, the computer might alternatively be a processor embedded in the processing tool 1310. The computer might also be a laptop, a workstation, or a mainframe in various other embodiments. The scope of the invention is not limited by the type or nature of the program storage medium or computer with which embodiments of the invention might be implemented.

Thus, some portions of the detailed descriptions herein are, or may be, presented in terms of algorithms, functions, techniques, and/or processes. These terms enable those skilled in the art most effectively to convey the substance of their work to others skilled in the art. These terms are here, and are generally, conceived to be a self-consistent sequence of steps leading to a desired result. The steps are those requiring physical manipulations of physical quantities. Usually, though not necessarily, these quantities take the form of electromagnetic signals capable of being stored, transferred, combined, compared, and otherwise manipulated.

It has proven convenient at times, principally for reasons of common usage, to refer to these signals as bits, values, elements, symbols, characters, terms, numbers, and the like. All of these and similar terms are to be associated with the appropriate physical quantities and are merely convenient labels applied to these quantities and actions. Unless specifically stated otherwise, or as may be apparent from the discussion, terms such as "processing," "computing," "calculating," "determining," "displaying," and the like, used herein refer to the action(s) and processes of a computer system, or similar electronic and/or mechanical computing device, that manipulates and transforms data, represented as physical (electromagnetic) quantities within the computer system's registers and/or memories, into other data similarly represented as physical quantities within the computer system's memories and/or registers and/or other such information storage, transmission and/or display devices.

Any of the above-disclosed embodiments of a method of manufacturing according to the present invention enables the reduction of interlayer dielectric layer thickness variations before any planarization process is performed on the interlayer dielectric layer. Any of the above-disclosed embodiments of a method of manufacturing according to the present invention enables the reduction of the variations in the thickness of the total interlayer dielectric layer during the formation of the interlayer dielectric layer. Moreover, achieving the proper post-polish thickness of the interlayer dielectric layer may involve the removal of much less dielectric material, during a chemical-mechanical planarization (CMP), for example, than in conventional processes forming such an interlayer dielectric layer. Additionally, any of the above-disclosed embodiments of a method of manufacturing according to the present invention enables semiconductor device fabrication with increased device accuracy and precision, increased efficiency and increased device yield, enabling a streamlined and simplified process flow, thereby decreasing the complexity and lowering the costs of the manufacturing process and increasing throughput.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention.

What is claimed:

1. A method comprising:
    forming a first dielectric layer on a workpiece;
    measuring a thickness of said first dielectric layer; and
    forming a second dielectric layer above said first dielectric layer, said second dielectric layer being formed to a thickness that is determined based upon said measured thickness of said first dielectric layer.

2. The method of claim 1, wherein forming said first dielectric layer comprises forming said first dielectric layer to at least partially fill gaps between structures formed on the workpiece.

3. The method of claim 2, wherein forming said first dielectric layer to at least partially fill the gaps between the structures formed on the workpiece comprises forming said first dielectric layer to at least partially fill the gaps between metal structures formed on the workpiece.

4. The method of claim 1, wherein forming said first dielectric layer comprises forming said first dielectric layer comprised of at least one of an oxide, an oxynitride and a nitride.

5. The method of claim 1, wherein forming said first dielectric layer comprises forming said first dielectric layer by performing at least one of a CVD process, an LPCVD process and an HDP process.

6. The method of claim 1, further comprising performing a chemical mechanical planarization process on said second dielectric layer.

7. The method of claim 1 wherein forming said second dielectric layer comprises forming said second dielectric layer by performing at least one of a CVD process, an LPCVD process and an HDP process.

8. The method of claim 1, wherein forming said second dielectric layer comprises forming said second dielectric layer comprised of at least one of an oxide, an oxynitride and a nitride.

9. The method of claim 1, further comprising feeding forward the measured thickness of said first dielectric layer to a deposition tool used to form said second dielectric layer to said determined thickness.

10. A method comprising:
    depositing a first dielectric layer on a workpiece;
    measuring a thickness of said first dielectric layer; and
    depositing a second dielectric layer above said first dielectric layer, said second dielectric layer being formed to a thickness that is determined based upon said measured thickness of said first dielectric layer.

11. The method of claim 10, wherein depositing said first dielectric layer comprises depositing said first dielectric layer to at least partially fill gaps between structures formed on the workpiece.

12. The method of claim 11, wherein depositing said first dielectric layer to at least partially fill the gaps between the structures formed on the workpiece comprises depositing said first dielectric layer to at least partially fill the gaps between metal structures formed on the workpiece.

13. The method of claim 10, wherein depositing said first dielectric layer comprises depositing said first dielectric layer comprised of at least one of an oxide, an oxynitride and a nitride.

14. The method of claim 10, wherein depositing said first dielectric layer comprises depositing said first dielectric layer by performing at least one of a CVD process, an LPCVD process and an HDP process.

15. The method of claim 10, further comprising performing a chemical mechanical planarization process on said second dielectric layer.

16. The method of claim 10, wherein depositing said second dielectric layer comprises depositing said second dielectric layer by performing at least one of a CVD process, an LPCVD process and an HDP process.

17. The method of claim 10, wherein depositing said second dielectric layer comprises depositing said second dielectric layer comprised of at least one of an oxide, an oxynitride and a nitride.

18. The method of claim 10, further comprising feeding forward the measured thickness of said first dielectric layer to a deposition tool used to form said second dielectric layer to said determined thickness.

19. A method comprising:

depositing a first dielectric layer on a workpiece to at least partially fill gaps between structures formed on the workpiece;

measuring a thickness of said first dielectric layer;

providing said measured thickness of said first dielectric layer to a controller that determines, based upon said measured thickness of said first dielectric layer, a thickness of a second dielectric layer to be formed above said first dielectric layer; and depositing said second dielectric layer above said first dielectric layer, said second dielectric layer being deposited to said determined thickness.

20. The method of claim 19, wherein depositing said first dielectric layer to at least partially fill the gaps between the structures formed on the workpiece comprises depositing said first dielectric layer to at least partially fill the gaps between metal structures formed on the workpiece.

21. The method of claim 19, wherein depositing said first dielectric layer comprises depositing said first dielectric layer comprised of at least one of an oxide, an oxynitride and a nitride.

22. The method of claim 19, wherein depositing said first dielectric layer comprises depositing said first dielectric layer by performing at least one of a CVD process, an LPCVD process and an HDP process.

23. The method of claim 19, further comprising performing a chemical mechanical planarization process on said second dielectric layer.

24. The method of claim 19, wherein depositing said second dielectric layer comprises depositing said second dielectric layer by performing at least one of a CVD process, an LPCVD process and an HDP process.

25. The method of claim 19, wherein depositing said second dielectric layer comprises depositing said second dielectric layer comprised of at least one of an oxide, an oxynitride and a nitride.

* * * * *